(12) United States Patent
Wang et al.

(10) Patent No.: US 9,091,735 B2
(45) Date of Patent: Jul. 28, 2015

(54) METHOD FOR DETERMINING A STATE OF A RECHARGEABLE BATTERY DEVICE IN REAL TIME

(75) Inventors: Shuoqin Wang, Westlake, CA (US);
Mark W. Verbrugge, Troy, MI (US);
John S. Wang, Los Angeles, CA (US);
Ping Liu, Irvine, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 1041 days.

(21) Appl. No.: 12/912,407

(22) Filed: Oct. 26, 2010

(65) Prior Publication Data
US 2012/0101674 A1  Apr. 26, 2012

(51) Int. Cl.
*G01R 31/36* (2006.01)

(52) U.S. Cl.
CPC ........ *G01R 31/3651* (2013.01); *G01R 31/3624* (2013.01)

(58) Field of Classification Search
CPC ..... B60W 20/00; B60W 10/08; B60W 10/06; B60K 6/445; Y02T 10/6286; G01R 31/3651; G01R 31/3624
USPC .......... 701/22; 702/7, 31, 47, 57, 60, 61, 104; 320/100, 102
See application file for complete search history.

(56) References Cited

U.S. PATENT DOCUMENTS

| | | | |
|---|---|---|---|
| 4,595,880 A * | 6/1986 | Patil | 324/427 |
| 6,927,554 B2 | 8/2005 | Tate, Jr. et al. | |
| 6,947,855 B2 * | 9/2005 | Verbrugge et al. | 702/63 |
| 7,233,128 B2 * | 6/2007 | Brost et al. | 320/132 |
| 7,324,902 B2 * | 1/2008 | Verbrugge et al. | 702/64 |
| 7,580,803 B2 | 8/2009 | Hornick et al. | |
| 7,593,823 B2 | 9/2009 | Iwane et al. | |
| 7,612,532 B2 | 11/2009 | Verbrugge | |
| 7,768,233 B2 * | 8/2010 | Lin et al. | 320/132 |
| 7,888,912 B2 * | 2/2011 | Morita et al. | 320/132 |

OTHER PUBLICATIONS

John Newman and William Tiedemann, "Temperature Rise in a Battery Module with Constant Heat Generation"; Energy and Enviroment Division, Lawrence berkeley Laboratory, and Department of Chemical Engineering, University of California, Berkeley, California 94720; Johnson Controls Battery Group, Incorporated, Milwaukee, Wisconsin, 53201.*
Piller, Sabine, et al. "Methods for State-of-Charge Determination and their Applications," J of Power Sources, 96 (2001), pp. 113-120.
Verbrugge, Mark W., et al., "Electrochemical and Thermal Characterization of Battery Modules Commensurate w/ Electric Vehicle Integration" JECS, 149 (1) (2002), pp. A45-A53.
Verbrugge, Mark W., et al., "Adaptive Energy Management of Electric and Hybrid Electric Vehicles," JECS, 152 (2) (2005), pp. A333-A342.
Verbrugge, Mark W., et al., "Generalized Recursive Algorithm for Adaptive Multiparameter Regression," JECS, 153 (1) (2006), pp. A187-A201.
Verbrugge, Mark W., "Adaptive, Mulit-Parameter Battery State Estimator with Optimized Time-Weighting Factors," J Appln Electrochem, 37 (2007), pp. 605-616.

* cited by examiner

*Primary Examiner* — James Trammell
*Assistant Examiner* — James E Stroud
(74) *Attorney, Agent, or Firm* — Dierker & Associates, P.C.

(57) ABSTRACT

A method of determining and predicting a state of a rechargeable battery device in real time involves measuring a current and a voltage of the rechargeable battery in real time, inputting the measured current and voltage into an algorithm, and applying the algorithm to determine the state of the rechargeable battery. The algorithm includes a first mathematical model based on a direct solution of at least one differential equation characterizing an equivalent RC circuit of the battery as a function of time. The first model generates a plurality of parameters that are usable to determine the state of the battery. The algorithm further includes a second mathematical model configured to regress the parameters over time, and a third mathematical model configured to estimate the state of the battery.

12 Claims, 7 Drawing Sheets

METHOD FOR DETERMINING A STATE OF A RECHARGEABLE BATTERY DEVICE IN REAL TIME

TECHNICAL FIELD

The present disclosure relates generally to methods for determining a state of a rechargeable battery device in real time.

BACKGROUND

Hybrid electric and battery powered vehicles often utilize energy stored in a rechargeable battery to operate one or more systems of the vehicle. The rechargeable battery may be used, for example, in combination with an internal combustion engine to propel the vehicle (such as in hybrid electric vehicles), or may be used alone to propel the vehicle (such as in battery powered vehicles). In some cases, hybrid electric or battery powered vehicles include an estimator that may be utilized to determine at least the state of charge (SOC) and the state of power (SOP) of the rechargeable battery. This information may be used to apprise a vehicle operator of a then-current state of the battery.

SUMMARY

A method of determining a state of a rechargeable battery device in real time involves measuring a current and a voltage of the rechargeable battery in real time, and inputting the measured current and voltage into an algorithm. The algorithm includes a first mathematical model based on a direct solution of at least one differential equation characterizing an equivalent RC circuit of the rechargeable battery as a function of time. The first mathematical model is configured to generate a plurality of parameters that are usable to predict the state of the rechargeable battery device. The algorithm further includes a second mathematical model configured to regress the parameters over time, and a third mathematical model configured to estimate the state of the rechargeable battery device. The method still further involves applying the algorithm to determine the state of the rechargeable battery device.

BRIEF DESCRIPTION OF THE DRAWINGS

Features and advantages of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 7 shows predicted values of SOC are within +/−3% accuracy relative to measured values, FIG. 8 compares a predicted 2 second power projection with measured values, and FIG. 9 compares a predicted 10 second power projection with measured values.

DETAILED DESCRIPTION

Figure 1:
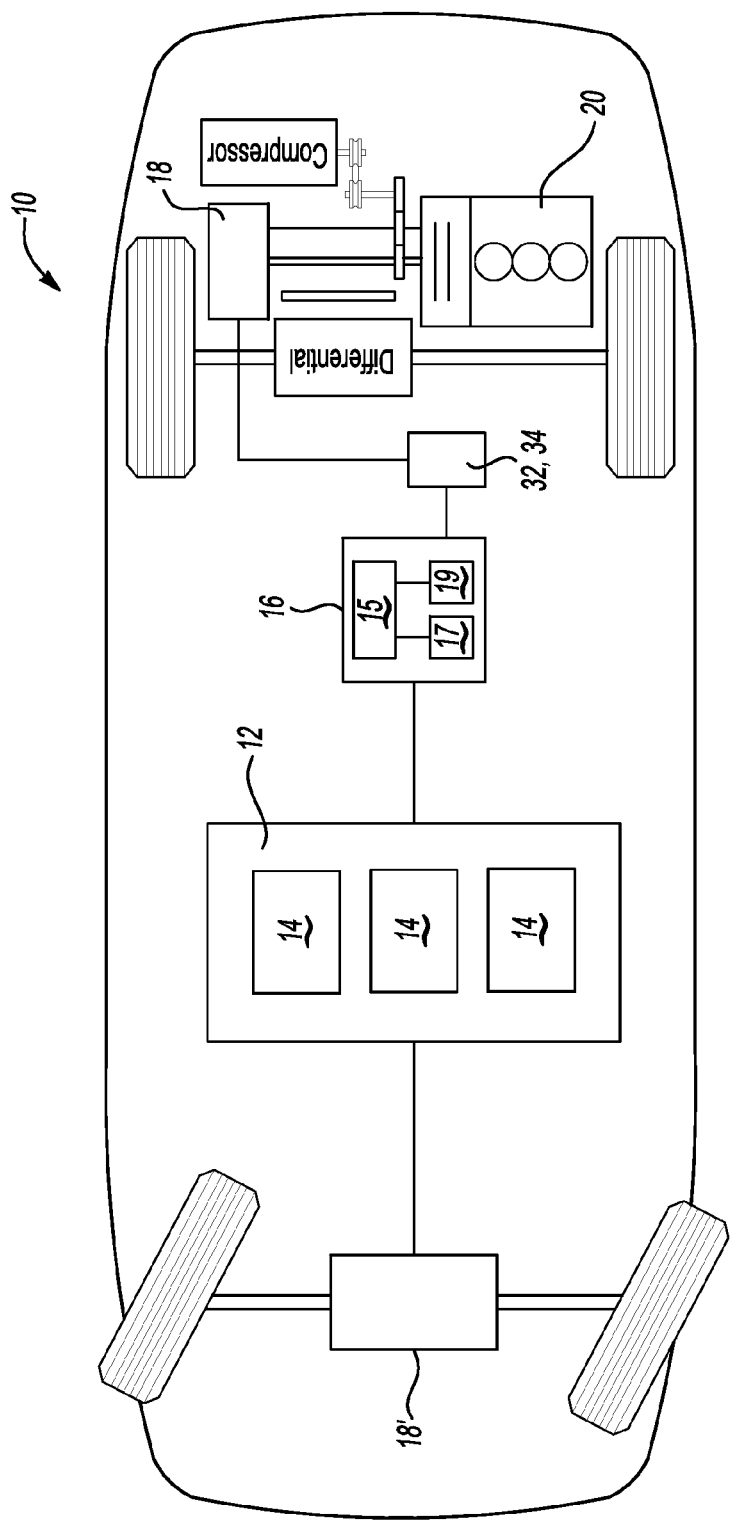
FIG. 1 schematically depicts an example of a bottom side of a hybrid electric vehicle.

Example(s) of the method disclosed herein may be used to quantitatively determine, and therefore predict at least the state of charge (SOC) and the state of power (SOP) of a rechargeable battery device in a vehicle, such as, for example a hybrid electric vehicle. An example of a hybrid electric vehicle 10 is depicted in FIG. 1. The vehicle 10 includes a module 12 containing at least one rechargeable battery 14. In instances where the module 12 includes a plurality of rechargeable batteries 14, the batteries 14 may be connected together in series and/or in parallel. Some non-limiting examples of rechargeable batteries include lithium ion batteries, lead acid batteries, and nickel metal hydride batteries.

Figure 2:
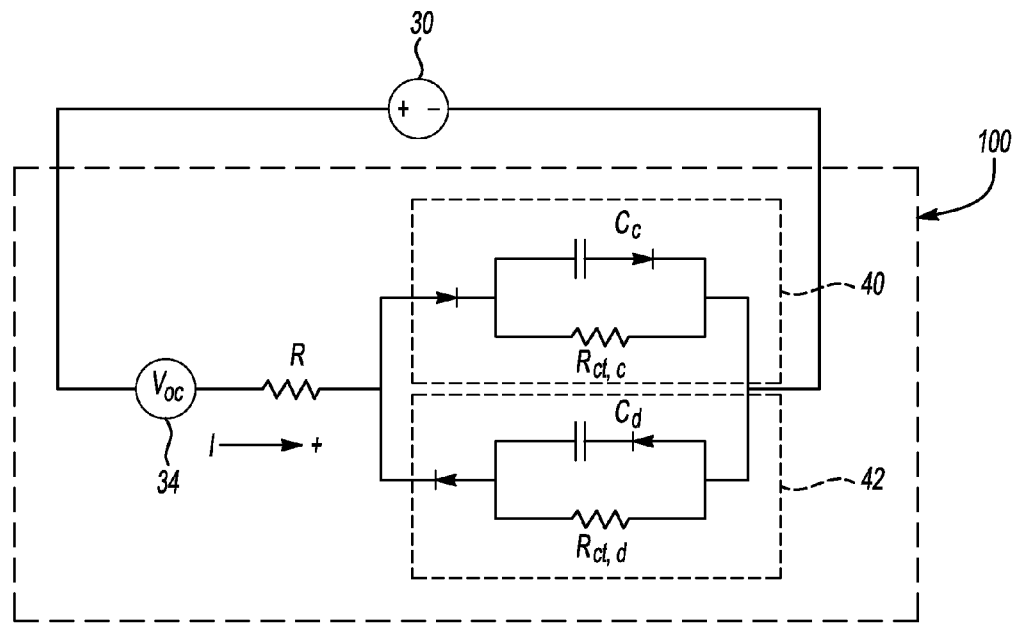
FIG. 2 is a schematic diagram of an example of an electric circuit of a battery module for use, for example, in the vehicle of FIG. 1.

The vehicle 10 further includes a controller 16 operatively associated with the battery module 12. The controller 16 is also operatively associated with memory 17 and a processor 15 operatively coupled to the memory 17 and to a computer-readable medium 19 encoded with one or more algorithms for determining at least the SOC and the SOP of the battery/ies 14. The measured current and voltage are retrieved by the controller 16 from their respective measuring devices, which are described hereinbelow. As will be described in detail below, current and a voltage is utilized by the processor 15 of the controller 16 as inputs for the algorithm in real time, and then the algorithm is executed by the processor 15 to determine the SOC and the SOP. As shown in FIG. 2, the vehicle 12 includes a current and voltage source 30, which generates current and voltage. Further the current and the voltage may be measured using respective measuring devices 32, 34. In an example, the device 32 is configured to measure a magnitude and direction of the current flowing through the battery/ies 14 (such as, e.g., an ammeter), while the device 34 is configured to measure an open circuit voltage ($V_{oc}$ of the battery/ies 14 (such as, e.g., a voltmeter). The circuitry for measuring the current and the voltage may, for example, be included in an integrated circuit.

The hybrid vehicle 10 also includes an electric motor/generator 18 that is dynamically connected to an internal combustion engine 20, and functions to either power the vehicle 10 (such as to propel the vehicle 10 to move forward or backward) or to charge the battery/ies 14 (e.g., when the vehicle 10 does not require power from the motor/generator 18 to propel the vehicle 10). In some instances, the vehicle 10 may also include another motor/generator 18' that is connected on an opposite end of the vehicle 10 from the engine 20. The direction of the electrical energy (e.g., the current flow) from the motor/generator 18 may be determined at least from the operating state of the vehicle 10. For instance, when the vehicle 10 is in a regenerative state (such as during braking), the current flows from the motor/generator 18 and ultimately to the battery module 12 to charge the battery/ies 14.

When the vehicle 10 is not in regenerative state (such as when the vehicle transmission system is in a drive mode), the current flows from the battery module 12 to the motor/generator 18 to propel the vehicle 10 in a forward motion.

It is to be understood that although a hybrid electric vehicle has been described herein, the method disclosed herein may be applied to other vehicles, such as, e.g., battery electric vehicles and capacitor/super capacitor electric vehicles.

In an example, the method disclosed herein utilizes an algorithm that may be run by the controller 16 that utilizes measured current and voltage (e.g., obtained from the devices 32, 34) to determine and predict a state of the battery/ies 14 (e.g., the SOC and/or the SOP). This algorithm is based on an adaptive and direct solution of the governing differential equations that characterize an open circuit representation of a single battery. The open circuit representation will be described below in conjunction with FIG. 2. The algorithm run by the controller 16 may be referred to herein as "the direct differential algorithm" or simply "the DD algorithm".

The inventors of the instant disclosure have found that the DD algorithm is a significant improvement over at least some other algorithms that have been used to determine the state of a battery in a vehicle. An example of one of the other algorithms includes the superposition integral (SI) algorithm. Basically, the SI algorithm employs a superposition integration scheme to predict, in real time, at least the SOC and the SOP of the rechargeable battery. In an example, current, voltage, and temperature of the battery are inputted into the algorithm, and the algorithm uses these inputs to regress certain model parameters of the battery, such as, e.g., an open circuit voltage ($V_{oc}$), a high-frequency resistance (R), a charge-transfer resistance ($R_{ct}$), and a capacitance (C) of the battery. The SOC and the SOP, for example, may then be determined from the regressed model parameters.

Certain drawbacks may be evident with the use of the SI algorithm for determining the battery state. For instance, the algorithm may be implemented with recursive relations using circuit parameters from previous time-steps and experimental measurements acquired in a current time step in order to regress new circuit parameters. This may be due, at least in part, to limited memory storage and/or limited computing speed of controllers embedded in the estimator running the SI algorithm. Once the new circuit parameters have been regressed, a method of weighted recursive least squares (WRLS) is employed which includes exponentially damping inputted data over time. The new circuit parameters may, in some instances, significantly impact the value of the parameters regressed by the estimator running the SI algorithm.

The inventors of the instant disclosure have discovered that the SI algorithm may, in some instances, become unstable at high sampling rates (e.g., for date-sampling frequencies above 10 Hz). For instance, certain tests have shown that the numerical stability of the regression of the model parameters may be sensitive to the inputted data. This sensitivity may lead to numerical anomalies in parameter regression. Additionally, the SI algorithm uses only one set of model parameters to describe both charging and discharging events of the battery. To accommodate a possibility of different electrode kinetics processes for charging and discharging, the SI algorithm thus employs a fixed parameter $r=R_{ct, charge}/R_{ct, discharge}$, which represents the ratio between the values of $R_{ct}$ for battery charging relative to battery discharging. Further, a charge-transfer time constant (i.e., $R_{ct}$ times C) is assumed to be the same for both the charging and discharging events.

In contrast, the inventors have found that the DD algorithm provides a more stable parameter regression compared with the SI algorithm. The DD algorithm treats the charging and discharging events of the battery separately, so there is no need for a parameter r as in the SI algorithms. Further, the DD algorithm is less sensitive to initial parameters, and has higher stability at high sampling rates compared with the SI algorithm.

As mentioned above, the DD algorithm employs a one RC-circuit model of a rechargeable battery, which is identified by reference numeral 100 in FIG. 2. The RC-circuit battery model 100 is connected with a current or voltage source 30. It is to be understood that the current or voltage source 30 may correspond to a motor/generator 18 as depicted in FIG. 1. The open circuit voltage $V_{oc}$ 34 is shown in series between the current or voltage source 30 and the high-frequency resistance R. The battery model 100 further includes a charging RC circuit 40 that is disposed in parallel to a discharging RC circuit 42, whereby the parallel RC circuits 40, 42 are disposed in the battery 14 in series with the high-frequency resistance R. The charging RC circuit 40 includes a charging capacitor $C_c$ and a charge transfer resistance $R_{ct,c}$ that is disposed in parallel with the charging capacitor $C_c$. The discharging RC circuit 42 includes a discharge capacitor $C_d$ and a discharge transfer resistance $R_{ct,d}$ that is disposed in parallel with the discharge capacitor $C_d$. Furthermore, diodes 34 are used in the circuit to constrain current I to flow in a direction indicated by convention through the RC circuits 40 and 42.

The DD algorithm generally includes a plurality of mathematical models that is used to ultimately predict a state of the rechargeable battery/ies 14. In an example, the DD algorithm includes a first mathematical model that may be used to generate a plurality of parameters of the battery/ies 14. The parameters that are generated by the first mathematical model include the high-frequency resistance R (measured in ohms), the charge transfer resistance $R_{ct\_c}$ (measured in ohms), the discharge transfer resistance $R_{ct\_d}$ (measured in ohms), the charge capacitance $C_c$ (measured in farads), the discharge capacitance $C_d$ (measured in farads), and the open circuit voltage $V_{oc}$ (measured in volts).

The first mathematical model is based on a direct solution of at least one differential equation characterizing the equivalent RC circuit 100 of the battery 14 as a function of time. The first mathematical model is derived from Kirchhoff's circuit laws applied to the one RC-circuit model 100 depicted in FIG. 2 to produce equation (1):

$$V = (R + R_{ct})I + RR_{ct}C\frac{dI}{dt} - R_{ct}C\frac{dV}{dt} + V_{oc} \qquad \text{(Equ. 1)}$$

where: V is a measured input voltage (in volts); I is a measured input current (in Amperes); and R, $R_{ct}$, C, and $V_{oc}$ are the parameters mentioned above that are regressed at each time step t (measured in seconds). The time derivatives of V and I may be derived directly from the measured values.

In an example, the difference between the charge kinetic process of the battery/ies 14 and the discharge kinetic process of the battery/ies 14 may be determined by expanding Equation (1) to produce Equation (2), which is further expanded into Equation (3) as follows:

$$V = \left[(R + R_{ct})I + RR_{ct}C\frac{dI}{dt} - R_{ct}C\frac{dV}{dt} + V_{OC}\right]_c + \qquad \text{(Equ. 2)}$$
$$\left[(R + R_{ct})I + RR_{ct}C\frac{dI}{dt} - R_{ct}C\frac{dCV}{dt} + V_{OC}\right]_d$$

$$V = \left[(R_c + R_{ct\_c})I_c + \right. \qquad \text{(Equ. 3)}$$
$$R_c R_{ct\_c} C_c \left(\frac{dI}{dt}\right)_c - R_{ct\_c} C_c \left(\frac{dV}{dt}\right)_c + V_{oc\_c}\right] +$$
$$\left[(R_d + R_{ct\_d})I_d + R_d R_{ct\_d} C_d \left(\frac{dI}{dt}\right)_d - R_{ct\_d} C_d \left(\frac{dV}{dt}\right)_d + V_{oc\_d}\right]$$

It is to be understood that, in Equations (2) and (3) above, all of the parameters/variables subscripted with the letter "d" are associated with the discharging process of the battery/ies 14, and all of the parameters/variables subscripted with the letter "c" are associated with the charging process of the battery/ies 14. As shown by equations (2) and (3), the DD algorithm treats the discharge and charge processes of the battery/ies 14 separately.

In an example, the parameters in Equations (2) and (3) are regressed by applying the measured values of the current I and voltage V of the battery/ies 14 in real time. Then, the derivatives of the current I and voltage V are approximated using the following difference equations:

$$\frac{dI}{dt} = (I(t) - I(t - \Delta t))/\Delta t \qquad \text{(Equ. 4)}$$

$$\frac{dV}{dt} = (V(t) - V(t - \Delta t))/\Delta t \qquad \text{(Equ. 5)}$$

In instances where the current I is positive (i.e., a charging state of the battery/ies 14), then the current $I_c$=I, and $(dI/dt)_c$=dI/dt, likewise the voltage $V_c$=V and $(dV/dt)_c$=dV/dt. Furthermore, all of the variables associated with the discharging state of the battery/ies 14 are set to zero. In instances where the current I is negative (i.e., a discharging state of the battery/ies 14), then the current $I_d$=I, and $(dI/dt)_d$=dI/dt, and the voltage Vd=V and $(dV/dt)_d$=dV/dt. In this case, all of the variables associated with the charging state of the battery/ies 14 would be set to zero.

In an example, Equation (3) above may be simplified by assuming that the discharge resistance $R_d$=$R_c$=R, at least in part because the observed difference between the high-frequency impedance for the charging and discharging events is relatively small (e.g., is mathematically negligible). For instance, a lithium ion battery may have slight hysteresis in cell potential as a function of its state of charge (SOC) at a C/3 rate (i.e., the charge (or discharge) rate equal to the total capacity divided by 3 hours (e.g., a C/3 rate for a 6 Ah battery is about 2 A). As such, it is may be reasonable to assume that the hysteresis is minimal for the relationship between the open circuit voltage $V_{oc}$ and the SOC. In other words, the open circuit voltage during the charging state $V_{oc\_c}$=$V_{oc\_d}$=$V_{oc}$. The final equation of the DD algorithm for the lithium ion battery example would thus become:

$$V = (R + R_{ct\_c})I_c + RR_{ct\_c}C_c\left(\frac{dI}{dt}\right)_c - R_{ct\_c}C_c\left(\frac{dV}{dt}\right)_c + \qquad \text{(Equ. 6)}$$
$$(R + R_{ct\_d})I_d + RR_{ct\_d}C_d\left(\frac{dI}{dt}\right)_d - R_{ct\_d}C_d\left(\frac{dV}{dt}\right)_d + V_{oc}$$

In an example, the DD algorithm further includes a second mathematical model configured to regress the parameters over time. More specifically, the second mathematical model includes a weight recursive least squares (WRLS) method to exponentially damp the measured current and voltage over time. The WRLS model is described as follows. Consider a linear dynamical model with input variables $\{x_l(t), l=1,2,K, L\}$ and an output variable y(t), and assume that i) these variables are sampled at discrete times $\{t_j, j=1,2,3,K,N\}$ and ii) the sampled values may be related through the linear equation:

$$y(t_j) = \sum_{l=1}^{L} m_l x_l(t_j) \qquad \text{(Equ. 7)}$$

where $\{m_l, l=1,2,K,L\}$ are the L parameters to be identified. In the WRLS method, the parameters are determined by minimizing the sum of the weighted square of the error terms as follows:

$$\varepsilon = \sum_{l=1}^{L} \varepsilon_l = \sum_{l=1}^{L} \sum_{j=1}^{N} \lambda_l^{N-j} \left[y(t_j) - \sum_{l=1}^{L} m_l x_l(t_j)\right]^2, \qquad \text{(Equ. 8)}$$

where $\{\lambda_l, l=1, 2 \ldots L\}$ are the L exponential forgetting factors for time-weighting data. A larger weight factor $\lambda_l$ gives rise to a larger error term ε and thus more influence with regard to evaluating the parameter $m_n$, where n is 1, 2, 3 . . . 7. The approach employed allows for multiple forgetting factors, which is described in M. Verbrugge, J. Appl. Electrochem., 37, 605 (2007), the contents of which is incorporated herein by reference. The following assignments are made:

$y(t)=V(t)$ $x_1=I_c$   $m_1=R+R_{ct\_c}$ $x_2=I_d$   $m_2=R+R_{ct\_d}$ $x_3=(dI/dt)_c$   $m_3=RR_{ct\_c}C_c$ $x_4=(dI/dt)_d$   $m_4=RR_{ct\_d}C_d$ $x_5=(dV/dt)_c$   $m_5=R_{ct\_c}C_c$ $x_6=(dV/dt)_d$   $m_6=R_{ct\_d}C_d$ $x_7=1$   $m_7=V_{oc}$

The seven m parameters are updated at each time step, based on which model parameters are being regressed.

Figure 3:
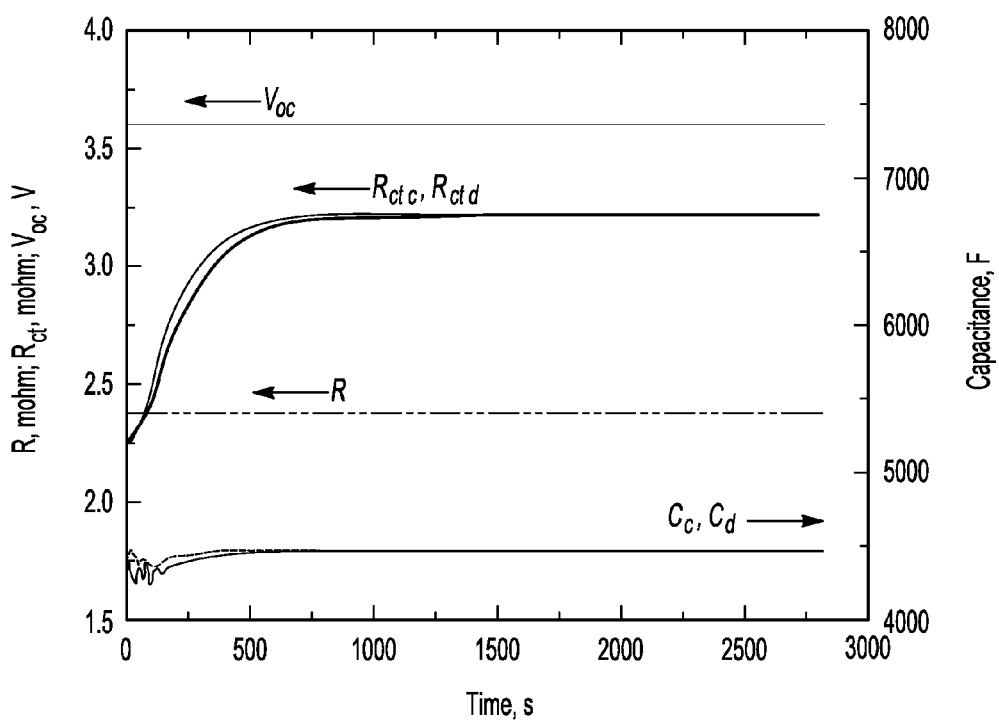
FIG. 3 is a graph showing the regressed model parameters obtained from an example of the algorithm disclosed herein.
Figure 4:
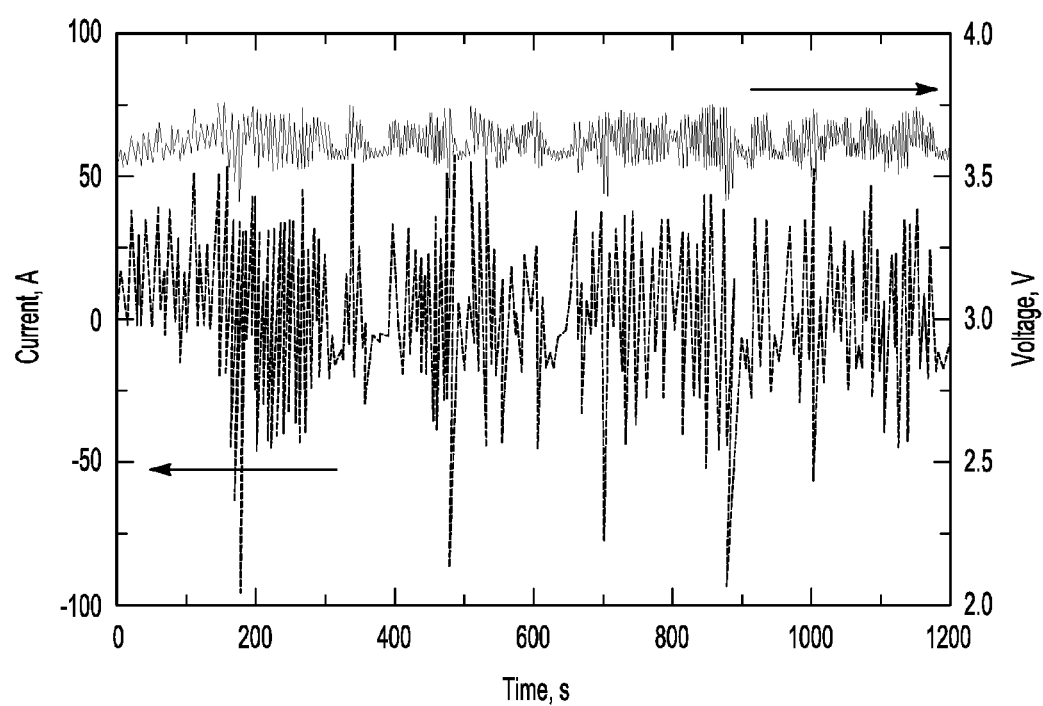
FIG. 4 is a graph showing the measured current and voltage of the battery during a cycling process.

Using the regressed model parameters, the state of charge (SOC) and/or the state of power (SOP) may be deduced. In an example, the DD algorithm includes a third mathematical model for estimating the SOC of the battery/ies 14 during i) a charging state, and ii) a discharging state. Equation (9) represents the SOC of the battery/ies 14 during a charging state:

$$SOC=w(SOC_C)+(1-w)(SOC_V) \qquad \text{(Equ. 9)}$$

where w is a weighting parameter that is set as an input variable, $SOC_C$ is the state of charge during the charging state, and $SOC_V$ is the state of charge with respect to an open circuit voltage $V_{oc}$ of the battery/ies 14. The $SOC_C$ may be calculated via charge integration, and the $SOC_V$ is related to the $V_{oc}$ by means of a $V_{oc}$ vs. SOC or state of discharge (SOD) curve as shown in FIG. 3. The SOC was deduced by coulomb counting, and the measurements were conducted at C/3 rate and at room temperature. A curve-fit to an average of the charge and discharge curves in FIG. 3 was used to produce a look-up table that may be used to determine the $SOC_V$. In an example, the look up table may be used by looking up a voltage value in the table that is close to a measured voltage, and then take an associated SOC from the table.

The $SOC_c$ may be calculated in real time in recursive fashion via equation (10) as follows:

$$SOC_c(t) = SOC(t - \Delta t) + \frac{100 \cdot I(t) \cdot \Delta t}{Ah_{nominal}} \quad \text{(Equ. 10)}$$

where t is the then-current time measured in seconds, $\Delta t$ is the change in time measured in seconds, I(t) is the current as a function of time measured in amps, and $Ah_{nominal}$ is the Ampere-hours of a capacity the battery/ies 14 when the battery/ies 14 is/are discharged from 100% to 0% state of charge at a discharging rate ranging from C/2 to C/20, where C is the rate of charging the battery/ies 14 in one hour. The factor 100 is used in Equation 10 to keep a consistent percent basis. It is to be understood that the $SOC_c$ calculation ignores self-discharging of the battery/ies 14 and any inefficiencies with respect to current flow.

In an example, the third mathematical model may be used to estimate the state of power (SOP) of the battery/ies 14. This may accomplished by estimating the charge and discharge power capabilities of the battery/ies 14 in real time, and then estimating current as a function of time I(t). The charging power capability may be obtained when the battery voltage is set to its maximum value, and the discharging power capability is obtained when the voltage is set to its minimum. In an example, the power capability P for charge/discharge may be determined from equation 11 below:

$$P_{charge(discharge)}(t) = I_{charge(discharge)}(t) \cdot V_{max(min)} \quad \text{(Equ. 11)}$$

The current I(t) may be determined when the voltage is set at its maximum or minimum value. In instances where the battery/ies 14 is/are in a charging state, the current I(t) may be determined using Equation (12):

$$I_{charge}(t) = \frac{V_{max} - V_{oc}}{R + R_{ct\_c}} + \left(\frac{V_{max} - V + IR}{R} - \frac{V_{max} - V_{oc}}{R + R_{ct\_c}}\right) \exp\left(-\frac{R + R_{ct\_c}}{RR_{ct\_c}C_c}t\right) \quad \text{(Equ. 12)}$$

In instances where the battery/ies 14 is/are in a discharging state, the current I(t) may be determined using Equation (13):

$$I_{discharge}(t) = \frac{V_{min} - V_{oc}}{R + R_{ct\_d}} + \left(\frac{V_{min} - V + IR}{R} - \frac{V_{min} - V_{oc}}{R + R_{ct\_d}}\right) \exp\left(-\frac{R + R_{ct\_d}}{RR_{ct\_d}C_d}t\right) \quad \text{(Equ. 13)}$$

To further illustrate the present disclosure, examples are given herein. It is to be understood that these examples are provided for illustrative purposes and are not to be construed as limiting the scope of the disclosed embodiment(s).

EXAMPLES

In order to examine the regression accuracy of the DD algorithm (also referred to herein as the DD state estimator), a computer simulation was run within a test environment using simulated data. For this simulation, values were prescribed for the model parameters of the RC circuit. Based on the values of current I(t), voltage data V(t) were determined, and the calculated values for I(t) and V(t) were employed for real-time regression. Further, the effectiveness of the algorithm was assessed by comparing the regressed parameter values to the prescribed values.

As an example of the simulation test, the current data was synthesized by adding together four sine waves with random initial phases. The frequencies of the sine waves were 0.001 Hz, 0.01 Hz, 0.1 Hz, and 1 Hz, with an amplitude of 10 A. The time interval of the current data was set to 100 msec. It is to be understood that the frequencies and amplitudes were selected as being representative for traction battery applications. Model parameters were prescribed as:

R=0.0024 Ohm, $R_{ct\_c}$=$R_{ct\_d}$=0.0032 Ohm, $C_c$=$C_d$=4500 F, $V_{oc}$=3.6 V.

The data and the selected parameters were used to calculate the system voltage using the circuit model. Then, the current and voltage data were input into the simulation algorithm to obtain the regressed model parameters, as shown in FIG. 3. The initial values of the parameters were chosen to be:

R=0.004 Ohm, $R_{ct\_c}$=$R_{ct\_d}$=0.0025 Ohm, $C_c$=$C_d$=4000 F and the initial open circuit voltage $V_{oc}$ was set to be equal to the first value of the voltage data. The forgetting factors $\lambda_1$ were set to 0.999 for every parameter. As shown in FIG. 3, the regressed values of the parameters are almost identical to the selected values, demonstrating the algorithm's accuracy in parameter regression. Further, it was discovered that the regression was effectively insensitive to the initial values inputted into the algorithm.

In order to evaluate the DD state estimator as a predictor of real time battery states under simulated driving conditions, the DD state estimator was implemented and integrated with a battery testing system also known as a Hardware-in-the-Loop (HWIL) system. (An example of a HWIL system is described in C. Massey, A. Bekaryan, M. Verbrugge, T. Weber, D. Frisch, L. Turner, A. Perulian and P. Liu, in SAE Commercial Vehicle Engineering Conference, Warrendale, Pa.: SAE International, (2005), the relevant portions of which are incorporated herein by reference.) The architecture of the HWIL basically includes three components: an electrochemical cell (EC) interface, a vehicle model, and an HWIL controller. The EC acts as an environmental interface to the electrochemical cell under test, and its main facilities include a single-channel tester (BT2000, Arbin Instruments) that provides up to 5 kW at potentials ranging from about 0.6 V to about 5 V+/−1 mV and current ranges up to about 1 kA+/−10 mA, and a thermal control chamber for accommodating the battery with a programmable range from about −40° C. to 130° C. (resolution of +/−1° C.). All of the tests were conducted at room temperature (e.g., about 24° C.). The vehicle model used was the Hybrid Powertrain Simulation Program (HPSP) provided by General Motors, Detroit, Mich. HPSP was applied to provide electric-power requirements based on specific driving profiles. The HWIL controller also served as the command center in safeguarding the process. For example, in a cycling process, as a power request is received from HPSP, the HWIL controller analyzes the request and, if valid, sends the request to the EC interface. The HWIL also receives the I-V-T (i.e., current-voltage-temperature) response from the interface, iterates through the DD algorithm with the I-V-T data, and provides feedback to the HPSP for its preparation of its next power request. Concurrently, the HWIL controller continuously monitors the system to ensure operation within specified limits so as to avoid abuse of the cell. Communications between the above mentioned modules were realized using TCP/IP protocols.

The battery used in these experiments was a single-cell lithium ion battery (Hitachi Automotive Products, model #A23-06H04-G00) which has a nominal capacity of 5.6 Ah and a voltage range of 2.7 to 4.1 V. A preprogrammed driving profile was used by the HPSP to submit the power demand to the cell. Further, the DD state estimator was tested by comparing predicted and measured SOC and SOP values using the procedure described hereinbelow.

An initial SOC value was randomly selected (e.g., ranging from about 30% to about 70%), and the corresponding open circuit potential $V_{oc}$ was obtained using a look-up table of the voltage-based state of charge. The battery was charged or discharged with a current rate of C/6 until reaching the value of $V_{oc}$, where the battery was allowed to rest for about 20 minutes. This process was used to render an accurate estimation of the initial $V_{oc}$ of the battery.

The cycling process was initiated, and the process lasted for at least about 10 minutes. During the process, the battery voltage and current was updated every 125±15 milliseconds.

The cycling process was stopped at a random time determined during the initial cycling process, and a choice of test (either an SOC test, a maximum charge power test, or a maximum discharge power test) was randomly selected. For the SOC test, the battery rested for one hour at the randomly selected time, and was then discharged with a constant current rate of C/3 until battery voltage dropped to its minimum value of $V_{min}$=2.7 V. The SOC was deduced by multiplying the discharge current with the discharge time divided by the battery's capacity.

The charge or discharge power tests were performed by setting the maximum or minimum voltage, respectively, on the battery and tracing its current as a function of time. The charge or discharge power capability as a function of time was determined by multiplying the current-time projection with the maximum or minimum voltage, respectively. The DD state estimator started to regress with all the model parameters initialized to their pre-setting values. During the regression, the regressed parameter values were also bounded. This is necessary since a real vehicle environment often includes noise due to electro-magnetic interference (EMI), which may lead the regression to spurious predictions. The initial value and the boundary values of each parameter used in the experiments are shown in Table 1 below:

TABLE 1 initial and allowable values for each parameter used in
the experiments described herein

| Quantity, units | Initial Value | Boundary Values [Min, Max] |
| --- | --- | --- |
| R, mohm | 4 | [0.4, 40] |
| $R_{ct\_c}$, mohm | 2.5 | [0.25, 25] |
| $R_{ct\_d}$, mohm | 2.5 | [0.25, 25] |
| $C_c$, F | 4000 | [400, 40000] |
| $C_d$, F | 4000 | [400, 40000] |
| Voc, V | Measured voltage-value at t = 0 | [2.7, 4.1] |
| W (weighting factor) | 0.995 | |
| $Ah_{nominal}$, Ahour | 5.6 | |
| $V_{min}$(SOC), V | 2.7 | |
| $V_{min}$(Power), V | 2.9 | |
| $V_{max}$(Power), V | 4.0 | |

As shown in Table 1, the upper and lower boundaries for the parameter values were set to be ten times larger or smaller than the initial values. Further, all of the forgetting factors $\lambda_1$ were set to $\lambda$=0.999 for purposes of simplifying of the calculation, and the initial value of the parameter $V_{oc}$ was set to be the measured voltage at the start of the regression. The sampling period dt was 125 milliseconds, and thus $$\Delta t = \frac{dt}{1-\lambda} = 125 \text{ s}$$

was approximately the time duration over which past data impacted the regression. It should be noted, however, the algorithm keeps the capability in fine tuning each $\lambda_1$ to improve the regression accuracy. For instance, the value of $\lambda_1$ for $V_{oc}$ may be set at a smaller value to capture fast SOC variations with current.

Figure 5:
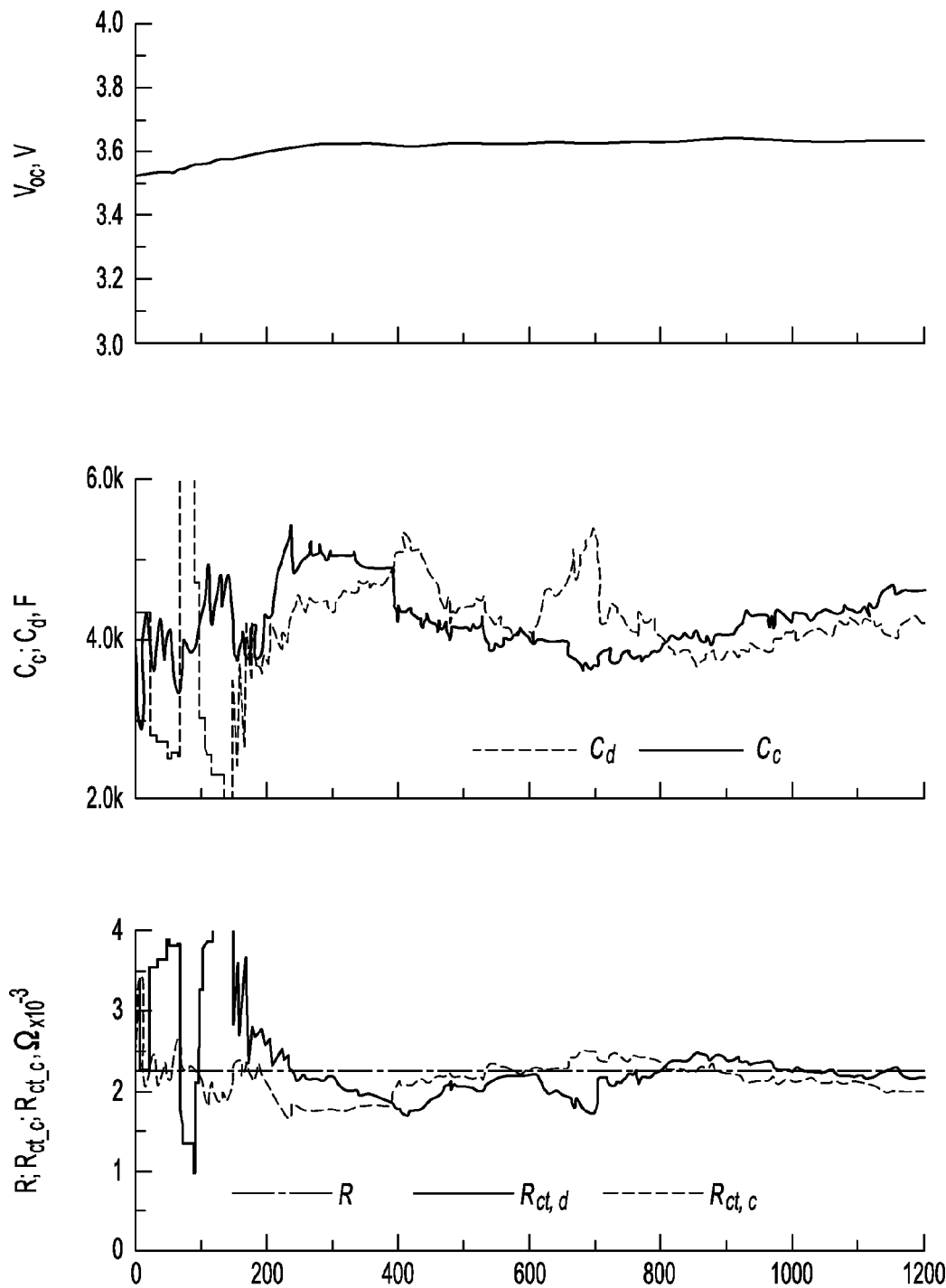
FIG. 5 is a series of graphs showing the results of a charge-power test that was performed on a lithium ion battery.

Another random trial was performed, where this random trail highlighted charge-power capability of the battery. Based on initial values, boundary conditions, forgetting factors of the parameters, and the updated variables I, V of the battery, the DD state estimator regressed the model parameters recursively and their final values are depicted in FIG. 5. As shown in FIG. 5, the high-frequency resistance R remains almost the same throughout the driving process, which is consistent with a constant number of charge carriers in the electrolyte phases and little change in the solid phase electronic resistance in the lithium ion battery. The open-circuit potential $V_{oc}$ increases slightly since the driving profile has more charge cases than discharge cases. Further, there are quantitative differences between the regressed charge and discharge parameter values for charge-transfer resistance and capacitance. All of the parameters were regressed within their preset boundary values, which is indicative of DD state estimator stability. The discharge parameters have some cusps at the beginning of the cycling process because there was not enough discharge information to enable a stable regression. With the updated parameters, the algorithm predicted SOC and SOP in real time with the results. The SOC increases in the beginning period of 200 seconds and then remains nearly constant, which is consistent with the driving profile.

Figure 6:
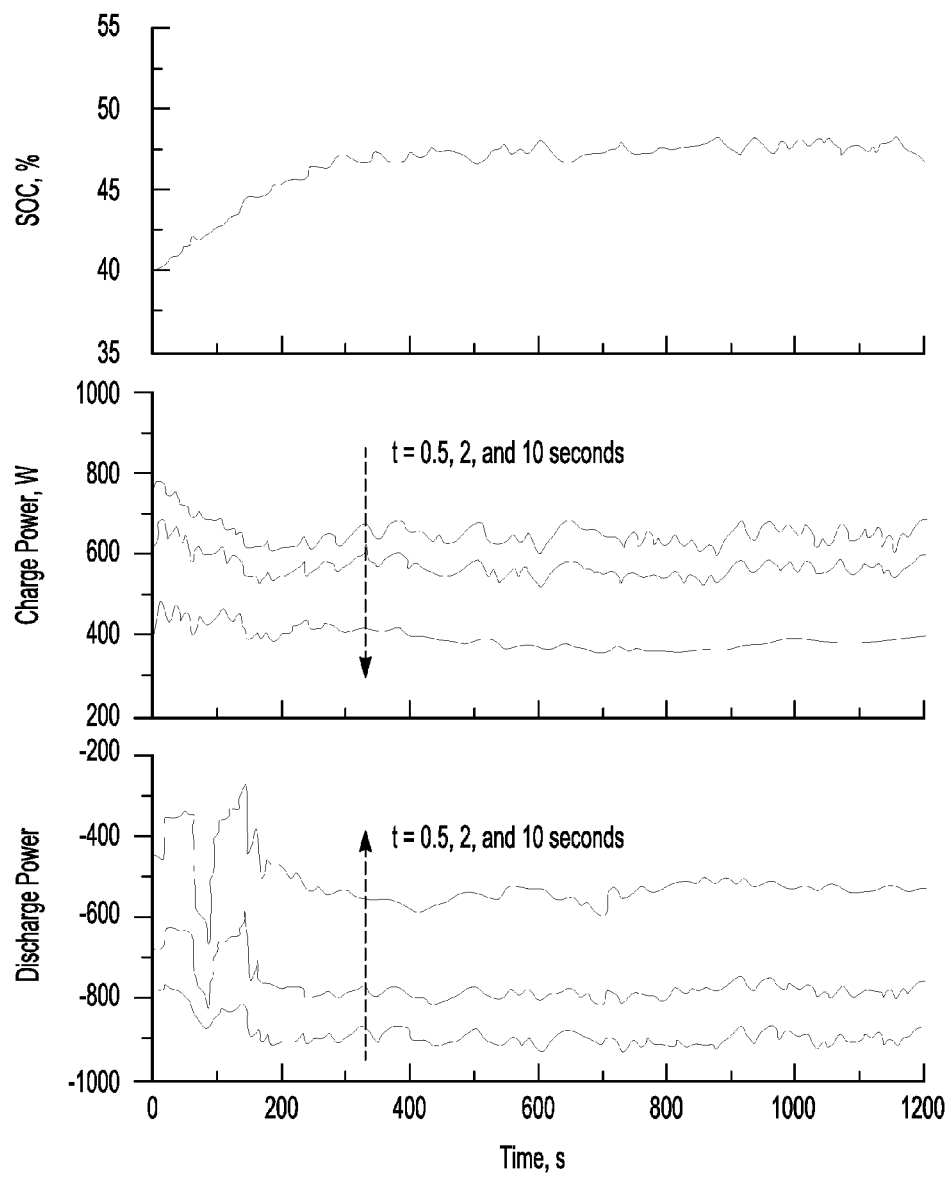
FIG. 6 is a series of graphs showing predicted state of charges (SOC) and the charge and discharge power projections of a lithium ion battery that occur at time (t) of 0.5 seconds, 2 seconds, and 10 seconds during a cycling process.
Figure 10:
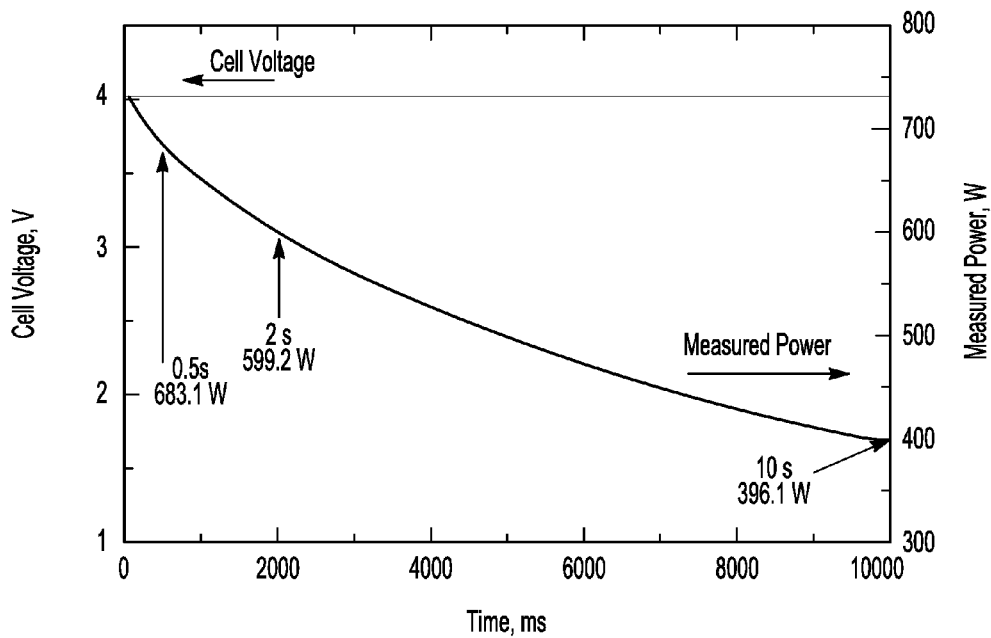
FIG. 10 is a graph depicting the measured discharging power of the battery versus the time as the battery voltage is clamped at 4 V after 1200 seconds.

As mentioned earlier, the DD algorithm uses equations 11 to 13 to predict power capabilities. The predicted SOCs as well as charge and discharge power projections occur at t=0.5 seconds, 2 seconds, and 10 seconds during the cycling process as shown in FIG. 6. At the end of the cycling, as the cycling duration reached 1200 seconds in this example, the charge-power test was performed on the battery with results presented in FIG. 10. In this test, the battery voltage was clamped to 4 V, which corresponds to the maximum voltage $V_{max}$ used in the algorithm for calculating the power capabilities. The battery's current, and consequently the power, were then sampled with 0.1 sec intervals and recorded for 10 seconds. Predicted values of the charge power were compared with the measured values, and the results are presented in Table 2 below.

TABLE 2

Comparison between predicted values of the charge power
and measured values of charge power

| Projected Time | Predicted Power | Measured Power | Difference |
| --- | --- | --- | --- |
| 0.5-sec | 687.1 W | 683.1 W | 0.5% |
| 2-sec | 599.4 W | 599.2 W | 0.03% |
| 10-sec | 405.8 W | 396.1 W | 2.5% |

The measured values agree with the predicted values for the 0.5 second and 2 second power results, while the 10 second power projections show a larger deviation. In general, SOP prediction accuracy is greater for shorter time intervals; and the short-term power is mainly determined by the high-frequency resistance R, and the regression of R is stable and accurate. This leads to accurate short-term power predictions.

Figure 7:
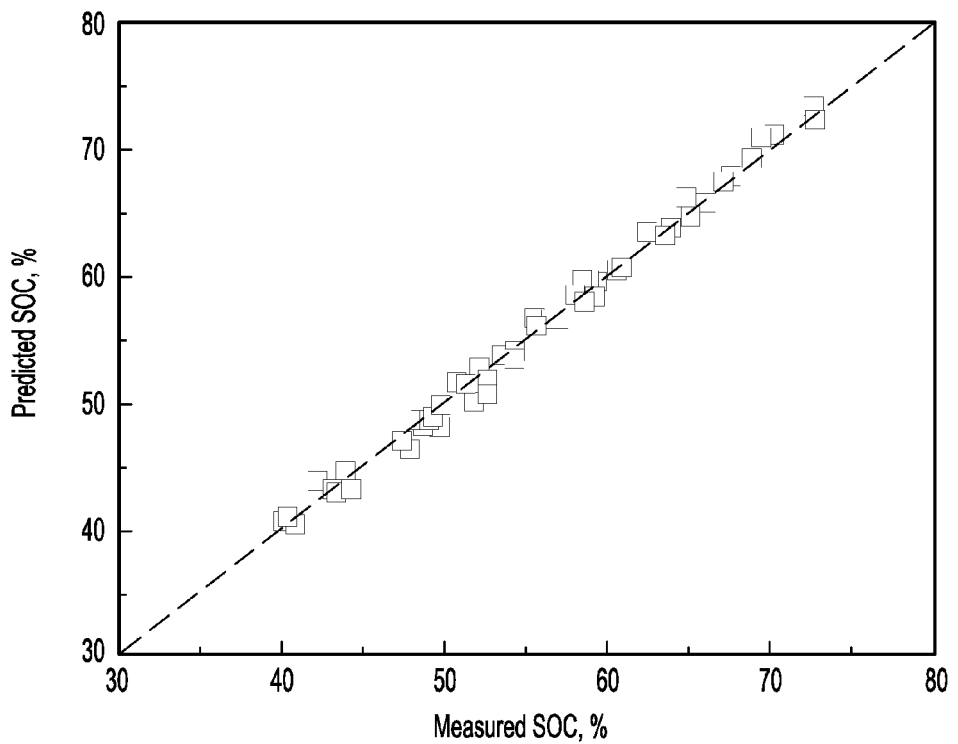
FIGS. 7 through 9 are graphs summarizing the results of 150 random tests on the state of charge (SOC) and the state of power (SOP) of a lithium ion battery, where
Figure 8:
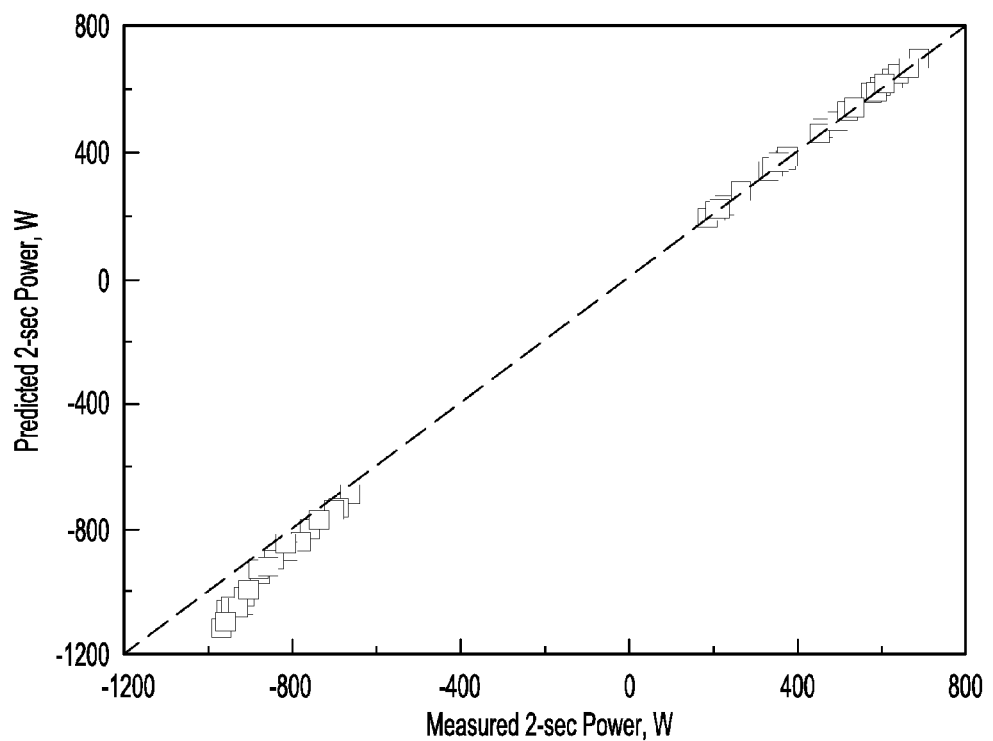
Figure 9:
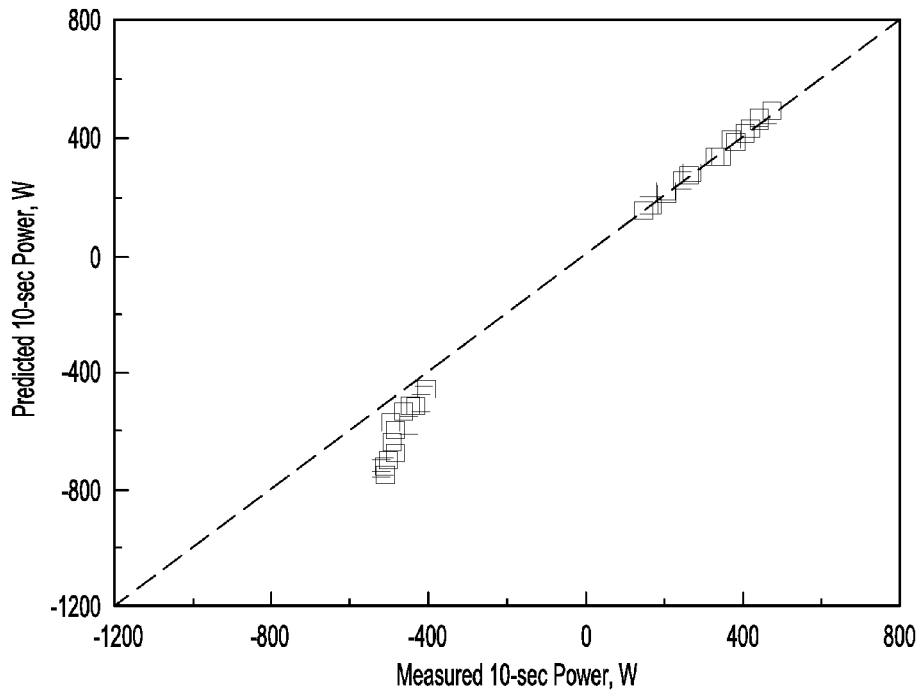

FIGS. 7 through 9 summarize the results of 150 random tests on SOC and SOP of a lithium ion battery. Each data point in the figures corresponds to a random test. In FIG. 7, the predicted values of SOC are within +/−3% accuracy relative to the measured values. These errors are likely due to numerical errors in coulomb integration. Since the weighting factor w was initialized with 0.995 in the algorithm, the agreement of SOC results verifies that for this battery, the SOC is dominated by coulomb counting. FIG. 8 demonstrates the predicted 2 second power projections against the measured values. The positive values correspond to charge-power tests, while the negative values refer to discharge-power tests. The charge-power projections are quite accurate, while the discharge-power projections are larger than those measured. The deviations tend to grow as the power magnitude increases. Further, FIG. 9 compares the predicted 10 second power projections with measured values. Similar to the 2 second results, predictions of the charge power capabilities were excellent, while the predicted discharge powers were larger than those measured, and the deviation became larger as the power magnitude increased.

While several examples have been described in detail, it will be apparent to those skilled in the art that the disclosed examples may be modified. Therefore, the foregoing description is to be considered non-limiting.

The invention claimed is:

1. A method of determining and predicting a state of a rechargeable battery device in real time, comprising:
    via respective measuring devices, measuring a current and a voltage of the rechargeable battery in real time;
    via a processor executing computer readable instructions and operatively coupled to a memory and to a non-transitory, tangible computer-readable medium, the processor performing steps including:
        determining that the battery is charging based on the current being positive, or that the battery is discharging based on the current being negative;
        determining a time derivative of the current and a time derivative of the voltage;
        estimating, based on results of an execution of a weighted recursive least squares regression of a linear solution of an equivalent circuit for the battery, for time intervals over a time duration, parameters including the voltage of the rechargeable battery, an open circuit voltage of the rechargeable battery, and a high-frequency resistance of the rechargeable battery;
        estimating, based on the results of the execution of the weighted recursive least squares regression of the linear solution of the equivalent circuit for the battery, for the time intervals over the time duration, if the battery is charging, the parameters further including a charge-transfer resistance, current and capacitance of the rechargeable battery for a charging state and excluding a charge-transfer resistance, current and capacitance of the rechargeable battery for a discharging state;
        estimating, based on the results of the execution of the weighted recursive least squares regression of the linear solution of the equivalent circuit for the battery, for the time intervals over the time duration, if the battery is discharging, the parameters further including the charge-transfer resistance, current and capacitance of the rechargeable battery for the discharging state; and excluding the charge-transfer resistance, current and capacitance of the rechargeable battery for the charging state; and
        estimating the state of the rechargeable battery for the time intervals over the time duration based on the parameters.

2. The method as defined in claim 1 wherein the state of the rechargeable battery is a state of charge determined by the processor by summing a product of a weighting factor and a state of charge during a charging state of the rechargeable battery and an other product of the state of charge with respect to the open circuit voltage of the rechargeable battery and a difference of the weighting factor from unity.

3. The method as defined in claim 2 wherein the state of charge during the charging state of the rechargeable battery is determined by comparing a time integration of the current to a nominal battery capacity.

4. The method as defined in claim 1 wherein the state of the rechargeable battery is a state of power (SOP) determined by estimating the current as a function of time based on the parameters and estimating a charging power capability of the rechargeable battery based on the estimated current as a function of time and a maximum voltage.

5. The method as defined in claim 1 wherein the state of the rechargeable battery is a state of power (SOP) determined by estimating the current as a function of time based on the parameters and estimating a discharging power capability of the rechargeable battery based on the estimated current as a function of time and a minimum voltage.

6. A control system for a vehicle, comprising:
    a module including a rechargeable battery;
    a first device for measuring a magnitude and direction of current flowing through the rechargeable battery;
    a second device for measuring a voltage of the battery; and
    a controller operatively associated with the module, the controller including a processor operatively coupled to a memory and to a computer-readable medium encoded with computer-readable instructions to utilize measured current and voltage obtained from the first and second devices, respectively, to predict a state of the rechargeable battery, the computer-readable instructions to:
        determine that the battery is charging based on the current being positive, or that the battery is discharging based on the current being negative;
        determine a time derivative of the current and a time derivative of the voltage;
        estimate, based on results of an execution of a weighted recursive least squares regression of a linear solution of an equivalent circuit for the battery, for time intervals over a time duration, parameters including the voltage of the rechargeable battery, an open circuit voltage of the rechargeable battery, and a high-frequency resistance of the rechargeable battery;
        estimate, based on the results of the execution of the weighted recursive least squares regression of the linear solution of the equivalent circuit for the battery, for the time intervals over the time duration, if the battery is charging, the parameters further including a charge-transfer resistance, current and capacitance of the rechargeable battery for a charging state and excluding a charge-transfer resistance, current and capacitance of the rechargeable battery for a discharging state;
        estimate, based on the results of the execution of the weighted recursive least squares regression of the linear solution of the equivalent circuit for the battery, for the time intervals over the time duration, if the battery is discharging, the parameters further including the charge-transfer resistance, current and capacitance of the rechargeable battery for the discharging state and excluding the charge-transfer resistance, current and capacitance of the rechargeable battery for the charging state; and estimate the state of the rechargeable battery for the time intervals over the time duration based on the parameters.

7. The control system as defined in claim 6 wherein the state of the rechargeable battery is a state of charge (SOC) determined by the processor by summing a product of a weighting factor and a state of charge during a charging state of the rechargeable battery and an other product of the state of charge with respect to the open circuit voltage of the rechargeable battery and a difference of the weighting factor from unity.

8. The control system as defined in claim 7 wherein the state of charge during the charging state of the rechargeable battery is determined by comparing a time integration of the current to a nominal battery capacity.

9. The control system as defined in claim 6 wherein:
i) the state of the rechargeable battery is a state of power (SOP) determined by estimating the current as a function of time based on the parameters and estimating a charging power capability of the rechargeable battery based on the estimated current as a function of time and a maximum voltage; and
ii) the state of the rechargeable battery is a state of discharging power determined by estimating the current as a function of time based on the parameters and estimating a discharging power capability of the rechargeable battery based on the estimated current as a function of time and a minimum voltage.

10. The method as defined in claim 1 wherein the determining the charging state of the rechargeable battery includes assuming that a discharging state of the rechargeable battery is zero.

11. The method as defined in claim 1 wherein the determining the discharging state of the rechargeable battery includes assuming that a charging state of the rechargeable battery is zero.

12. A computer-readable non-transitory, tangible medium encoded with a computer program that includes computer-readable code for determining a state of a rechargeable battery device in real time, the computer-readable instructions to:

determine that the battery is charging based on the current being positive, or that the battery is discharging based on the current being negative;

determine a time derivative of the current and a time derivative of the voltage;

estimate, based on results of an execution of a weighted recursive least squares regression of a linear solution of an equivalent circuit for the battery, for time intervals over a time duration, parameters including the voltage of the rechargeable battery, an open circuit voltage of the rechargeable battery, a high-frequency resistance of the rechargeable battery;

estimate, based on the results of the execution of the weighted recursive least squares regression of the linear solution of the equivalent circuit for the battery, for the time intervals over the time duration, if the battery is charging, the parameters further including a charge-transfer resistance, current and capacitance of the rechargeable battery for a charging state and excluding a charge-transfer resistance, current and capacitance of the rechargeable battery for a discharging state;

estimate, based on the results of the execution of the weighted recursive least squares regression of the linear solution of the equivalent circuit for the battery, for the time intervals over the time duration, if the battery is discharging, the parameters further including the charge-transfer resistance, current and capacitance of the rechargeable battery for the discharging state and excluding the charge-transfer resistance, current and capacitance of the rechargeable battery for the charging state; and estimate the state of the rechargeable battery for the time intervals over the time duration based on the parameters.

* * * * *